United States Patent
Wang et al.

(10) Patent No.: US 8,390,188 B2
(45) Date of Patent: Mar. 5, 2013

(54) LIGHT EMITTING UNIT OF ELECTROLUMINESCENCE DEVICE CAPABLE OF INCREASING APERTURE RATE MANUFACTURING METHOD THEREOF

(75) Inventors: Hui-Jun Wang, Hsinchu (TW); Chieh-Wei Chen, Taichung County (TW); Chun-Hsiang Fang, Yilan County (TW)

(73) Assignee: Au Optronics Corporation, Hsinchu (TW)

( * ) Notice: Subject to any disclaimer, the term of this patent is extended or adjusted under 35 U.S.C. 154(b) by 213 days.

(21) Appl. No.: 12/961,510

(22) Filed: Dec. 7, 2010

(65) Prior Publication Data

US 2012/0068593 A1 Mar. 22, 2012

(30) Foreign Application Priority Data

Sep. 20, 2010 (TW) .............................. 99131831 A

(51) Int. Cl.
*H01J 1/62* (2006.01)
*H01J 9/00* (2006.01)
(52) U.S. Cl. ..... 313/498; 313/500; 313/506; 315/169.1; 315/169.3; 445/23
(58) Field of Classification Search .......... 313/498–512; 257/40, 269, 26; 445/24, 25
See application file for complete search history.

(56) References Cited

U.S. PATENT DOCUMENTS

| 7,183,707 | B2 | 2/2007 | Tyan et al. | |
| 7,271,535 | B2 | 9/2007 | Kobayashi | |
| 2001/0019244 | A1 | 9/2001 | Yamazaki et al. | |
| 2005/0040759 | A1* | 2/2005 | Kobayashi | 313/506 |
| 2005/0174064 | A1 | 8/2005 | Agostinelli et al. | |
| 2006/0138940 | A1 | 6/2006 | Liu | |
| 2008/0122352 | A1* | 5/2008 | Zhu et al. | 313/506 |
| 2008/0274660 | A1* | 11/2008 | Kobayashi | 445/24 |

FOREIGN PATENT DOCUMENTS

| EP | 0987774 | 3/2000 |
| JP | 2004-71395 | 3/2004 |
| TW | I231042 | 4/2005 |
| TW | 200605728 | 2/2006 |

OTHER PUBLICATIONS

"First Office Action of China Counterpart Application", issued on Mar. 8, 2012, p. 1-p. 7.
"Notice of Allowance of China counterpart application" issued on Aug. 15, 2012, p. 1-p. 4.

* cited by examiner

*Primary Examiner* — Tracie Y Green
(74) *Attorney, Agent, or Firm* — Jianq Chyun IP Office

(57) ABSTRACT

A light emitting unit of an electroluminescence device and a manufacturing method thereof are provided. The light emitting unit of the electroluminescence device includes a power line, a first electrode layer, a light emitting layer and a second electrode layer. The power line is on a substrate. The first electrode layer is disposed on the substrate and is electrically connected to the power line. In particular, a top portion of the first electrode layer has an oxygen concentration higher than that of a bottom portion of the first electrode layer. The light emitting layer is disposed on the first electrode layer and the second electrode layer is disposed on the light emitting layer.

22 Claims, 2 Drawing Sheets

LIGHT EMITTING UNIT OF ELECTROLUMINESCENCE DEVICE CAPABLE OF INCREASING APERTURE RATE MANUFACTURING METHOD THEREOF

CROSS-REFERENCE TO RELATED APPLICATION

This application claims the priority benefit of Taiwan application Ser. No. 99131831, filed on Sep. 20, 2010. The entirety of the above-mentioned patent application is hereby incorporated by reference herein and made a part of this specification.

BACKGROUND OF THE INVENTION

1. Field of the Invention

The invention relates to a light emitting unit of an electroluminescence device and a manufacturing method thereof. More particularly, the invention relates to a light emitting unit of an organic electroluminescence device and a manufacturing method thereof.

2. Description of Related Art

Organic electroluminescence devices are deemed as the mainstream among flat displays in the future for their advantageous characteristics such as compactness, self-luminescence, low power consumption, omission of back light source, free of viewing angle limitation, and high response speed. In addition, passive organic electroluminescence devices can form array structures on compact, flexible substrates, and are thus suitable for illumination applications. Generally, when having a light emitting efficiency of more than 100 Lm/W and a color rendering property thereof higher than 80, an organic luminescence device has the chance of replacing conventional illumination light source. Organic luminescence devices thus play an important role in illumination devices.

In a large-area organic electroluminescence device, the entire organic luminescence device may be short-circuited when an extraneous material is present. Consequently, the large-area organic electroluminescence device is usually divided into a plurality of small-area light emitting units, where an electric resistance wire is connected to each of the light emitting units. When one of the light emitting units is short-circuited, the electric resistance wire limits a current passing through the light emitting unit, so that the other light emitting units are not affected. Nevertheless, the disposition of the electric resistance wires lowers the overall aperture rate of the organic luminescence device.

SUMMARY OF THE INVENTION

The invention is directed to a light emitting unit of an electroluminescence device and a manufacturing method thereof, such that an overall aperture rate reduction of an organic electroluminescence device caused by the disposition of electric resistance wires in the organic electroluminescence device is prevented.

The invention is directed to a light emitting unit of an electroluminescence device. The light emitting unit includes a power line, a first electrode layer, a light emitting layer, and a second electrode layer. The power line is disposed on a substrate. The first electrode layer is disposed on the substrate and electrically connected to the power line. A top portion of the first electrode layer has an oxygen concentration higher than that of a bottom portion of the first electrode layer. The light emitting layer is disposed on the first electrode layer. The second electrode layer is disposed on the light emitting layer.

The invention is directed to a manufacturing method of a light emitting unit of an electroluminescence device. The method includes the following. A power line is formed on a substrate. A first electrode layer is formed on the substrate. The first electrode layer is electrically connected to the power line. A method of forming the first electrode layer includes performing a deposition process. The deposition process includes passing oxygen, and a concentration of oxygen passed in increases with a duration of the deposition process. A light emitting layer is formed on the first electrode layer. A second electrode layer is formed on the light emitting layer.

In light of the foregoing, the oxygen concentration of the top portion of the first electrode layer of the light emitting unit of the electroluminescence device in the invention is higher than the oxygen concentration of the bottom portion of the first electrode layer, so that a contact area of the first electrode layer and the light emitting layer has a higher resistance. Hence, when one of the light emitting units is short-circuited, as a resistance of the top portion of the first electrode layer is higher, a current passing through the light emitting unit aforementioned can be limited so as to prevent other light emitting units from being affected. In other words, as the first electrode layer having the top portion with a higher oxygen concentration is adopted in the invention, the traditional electric resistance wires can be omitted, such that the overall aperture rate of the electroluminescence device is increased.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
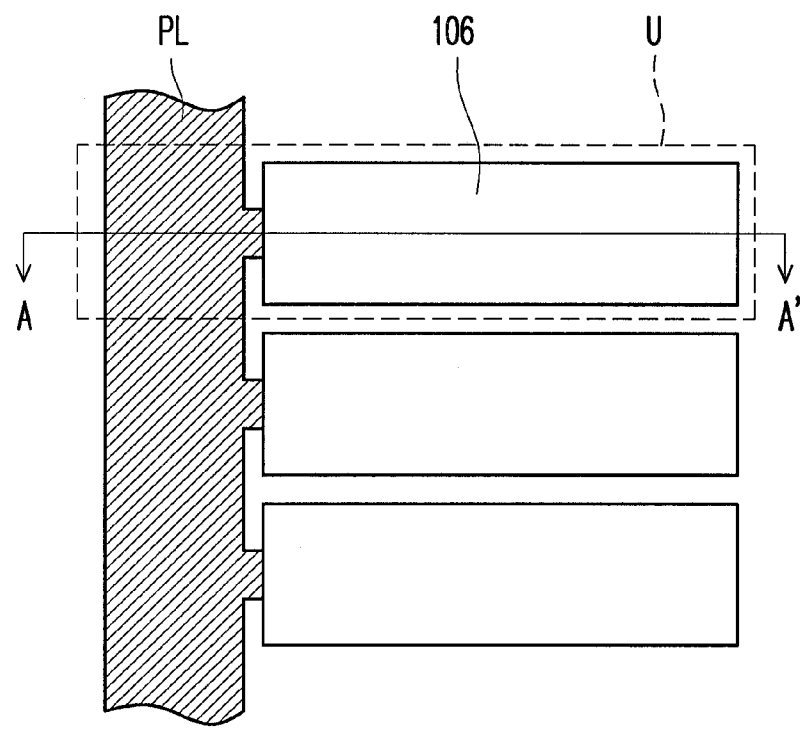
FIG. 1 illustrates a schematic partial top view of an electroluminescence device according to an embodiment of the invention.
Figure 2:
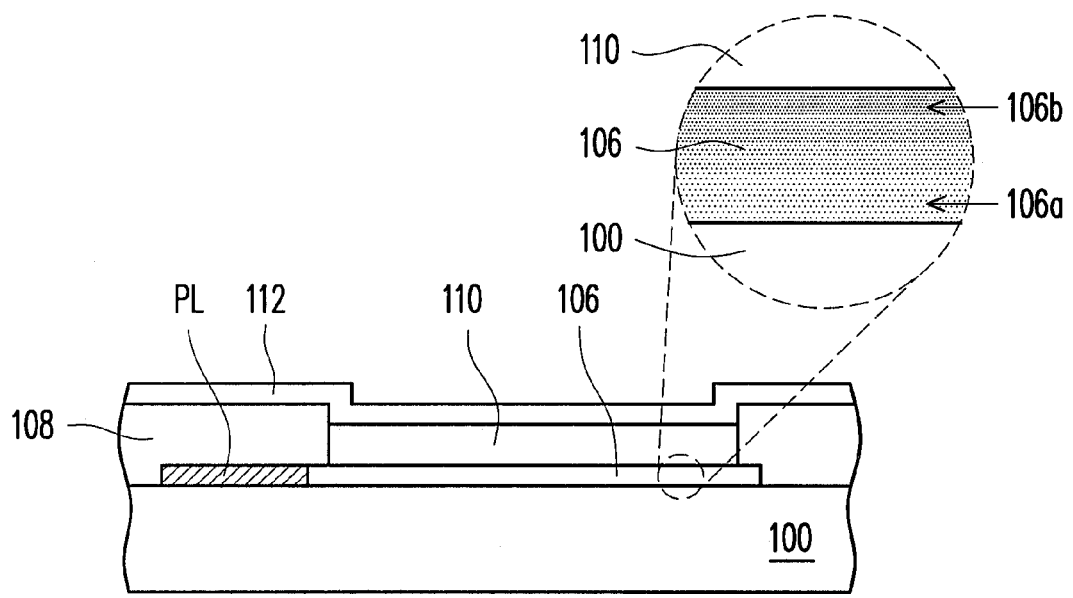
FIG. 2 shows a schematic cross-sectional view taken along line A-A' in FIG. 1.

FIG. 1 illustrates a schematic partial top view of an electroluminescence device according to an embodiment of the invention. FIG. 2 shows a schematic cross-sectional view taken along line A-A' in FIG. 1. In order to illustrate the present embodiment clearly, FIG. 1 merely illustrates a portion of a plurality of light emitting units in an electroluminescence device. In general, the electroluminescence device is constituted by a plurality of light emitting units U. Additionally, FIG. 1 only illustrates power lines and first electrode layers of a portion of the light emitting units. In practice, a constitution layer of the light emitting units of the electroluminescence device is depicted in FIG. 2.

Referring to FIGS. 1 and 2, a manufacturing method of an electroluminescence device in the present embodiment includes the following. A substrate 100 is provided. The substrate 100 is made of glass, quartz, organic polymers, plastics, flexible plastics, or an opaque/reflective material. A power line PL is formed on the substrate 100. In a method of forming the power line PL, a deposition process is performed to form a conductive layer (not shown) on the substrate 100. Thereafter, the conductive layer is patterned with a photolithographic process and an etching process to form a plurality of power lines. The power line PL mainly provides the electric power required by each of the light emitting units U. Thus, the power line PL electrically connects to a power supply device when extending to an edge of the substrate 100. The power line PL is usually fabricated with a metal material for conductivity, and the metal material includes, for example, copper, aluminum, silver, gold, titanium, molybdenum, tungsten, chromium, and an alloy thereof or a stacked layer thereof. However, the invention is not limited thereto. According to other embodiments, the power line PL can also be fabricated with other conductive material such as an alloy, a nitride of a metal material, an oxide of a metal material, an oxynitride of a metal material, or other suitable material), or a stacked layer of metal materials and other conductive materials.

Thereafter, a first electrode layer 106 is formed on the substrate 100. The first electrode layer 106 is electrically connected to the power line PL and is, for example, a cathode. In the present embodiment, the first electrode layer 106 is directly connected to the power line PL. According to the present embodiment, an edge of the first electrode layer 106 formed overlaps with an edge of the power line PL, so that the first electrode layer 106 electrically connects to the power line PL. The first electrode layer 106 includes a metal oxide, for instance, indium tin oxide, indium zinc oxide, aluminum tin oxide, aluminum zinc oxide, indium gallium zinc oxide, indium oxide, gallium oxide, zinc oxide, tin oxide, molybdenum oxide, vanadium oxide, antimony oxide, bismuth oxide, rhenium oxide, tantalum oxide, tungsten oxide, niobium oxide, nickel oxide, or other suitable metal oxide, or a stacked layer including at least two of the above oxides.

In particular, a method of forming the first electrode layer 106 includes performing a deposition process. The deposition process includes passing oxygen, where a concentration of oxygen increases with the duration of the deposition process. According to the present embodiment, the deposition process further includes passing an inert gas. The flow rate ratio of oxygen and the inert gas increases from 1:10 to 1:1 along with the duration of the deposition process. The inert gas includes argon gas, helium (He), neon (Ne), argon (Ar), krypton (Kr), xenon (Xe), radon (Rn), or a combination thereof.

In the first electrode layer 106 formed from the deposition process, a top portion thereof has a higher oxygen concentration than that of a bottom portion thereof. Preferably, the oxygen concentration in the first electrode layer 106 increases gradually from a bottom portion 106a to a top portion 106b. That is, the oxygen concentration in the first electrode layer 106 increases in gradients from the bottom portion 106a to the top portion 106b. The manner of the gradient increase of the oxygen concentration from the bottom portion 106a to the top portion 106b in the first electrode layer 106 is not limited in the invention. In other words, the oxygen concentration in the first electrode layer 106 increases from the bottom portion 106a to the top portion 106b in a ladder manner, a linear manner, or a curved manner. According to the present embodiment, the oxygen concentration in the first electrode layer 106 changes from 50 mol % to 70 mol % from the bottom portion 106a to the top portion 106b. The first electrode layer 106 is a single layer, for example.

As the oxygen concentration in the first electrode layer 106 gradually increases from the bottom portion 106a to the top portion 106b, a resistance of the first electrode layer 106 thus increases from the bottom portion 106a to the top portion 106b gradually. In the present embodiment, the resistance of the first electrode layer 106 changes from $1.5 \times 10^{-4}$ $\Omega \cdot cm$ to 5000 $\Omega \cdot cm$ from the bottom portion 106a to the top portion 106b.

It should be noted that in a manufacturing process of a traditional electroluminescence device, an ultraviolet-ozone treatment is performed to a surface of a first electrode layer after the first electrode layer is formed on a substrate, such that the first electrode layer has a suitable work function. However, in the present embodiment, as the top portion of the first electrode layer 106 has a higher oxygen concentration, the first electrode layer 106 already has a suitable work function. Thus, the above ultraviolet-ozone treatment is not required after the first electrode layer 106 is formed in the present embodiment. Additionally, metal oxides with higher oxygen concentration have higher penetration rate in general. Since the top portion of the first electrode layer in the present embodiment has a higher oxygen concentration, the first electrode layer 106 of the present embodiment has a higher penetration comparing to that of a conventional metal oxide.

After the first electrode layer 106 is formed, a light emitting layer 110 is formed on the first electrode layer 106. In the present embodiment, in order to dispose the light emitting layer 110 of each of the light emitting units U in a specific location, an insulation layer 108 is formed on the first electrode layer 106 before the light emitting layer 110 is formed. The insulation layer 108 exposes the first electrode layer 108 in each of the light emitting units U. Afterwards, the light emitting layer 110 can be formed on an exposed surface of the first electrode layer 106 by spraying. However, the formation of the insulation layer 108 is not required in the invention. In other embodiments, the fabrication of the insulation layer 108 can be omitted, and the light emitting layer 110 can be formed by a precise ink jet process or other fabrication method.

According to an embodiment of the invention, the light emitting layer 110 is a single-layer light emitting layer or a combination of a light emitting layer, an electron transmission layer, an electron injection layer, a hole transmission layer, and a hole injection layer. The light emitting layer is, for example, a white light emitting material layer or a light emitting material layer of other specific color (i.e. red, green, blue, and so on). Also, at least one of the electron transmission layer, the electron injection layer, the hole transmission layer, and the hole injection layer is adopted with the light emitting layer to constitute a stacked layer having two layers, three layers, four layers, or five layers, so as to enhance the light emitting efficiency of the light emitting layer 110. The detailed material and structure of the light emitting layer 110 should be known to people skilled in the art and are thus not repeated hereinafter.

It should be noted that the oxygen concentration in the first electrode layer 106 increases gradually from the bottom portion 106a to the top portion 106b, and the light emitting layer 110 is formed on the first electrode layer 106. Consequently, the oxygen concentration of the first electrode layer 106 close to the light emitting layer 110 is higher than the oxygen concentration of the first electrode layer 106 close to the substrate 100.

Next, a second electrode layer 112 is formed on the light emitting layer 110. In the present embodiment, the second electrode layer 112 is a striped conductive layer. The second electrode layer 112 of each of the light emitting units U can thus be disposed substantially perpendicular to the power line PL. Similarly, the second electrode layer 112 is, for example, a transparent electrode layer which is, for example, a metal oxide layer such as an indium tin oxide layer, an indium zinc oxide layer, an aluminum tin oxide layer, an aluminum zinc oxide layer, an indium gallium zinc oxide layer or other suitable metal oxide layer, or a stacked layer having at least two of the above metal oxide layers. Moreover, the second electrode layer 112 can also be a thin metal layer or a thin metal stacked layer having high transmittance. Obviously, according to other embodiments, the second electrode layer 112 can be a light-tight electrode layer.

It should be noted that when both of the first electrode layer 106 and the second electrode layer 112 are transparent electrode layers, the electroluminescence device formed in then a double-faced luminescence device. When the first electrode layer 106 is a transparent electrode layer and the second electrode layer 112 is a non-transparent electrode layer, the electroluminescence device formed is then a bottom emission luminescence device. When the first electrode layer 106 is a non-transparent electrode layer and the second electrode layer 112 is a transparent electrode layer, the electroluminescence device formed is then a top emission luminescence device.

A light emitting unit U of an electroluminescence device formed from the method aforementioned includes a power line PL, a first electrode layer 106, a light emitting layer 110, and a second electrode layer 112. The power line PL is disposed on a substrate 100. The first electrode layer 106 is disposed on the substrate 100 and electrically connected to the power line PL. A top portion 106b of the first electrode layer 106 has an oxygen concentration higher than that of a bottom portion 106a of the first electrode layer 106. The light emitting layer 110 is disposed on the first electrode layer 106. The second electrode layer 112 is disposed on the light emitting layer 110.

According to an embodiment of the invention, the oxygen concentration in the first electrode layer 106 increases gradually from the bottom portion 106a to the top portion 106b. The manner of the gradient increase of the oxygen concentration from the bottom portion 106a to the top portion 106b in the first electrode layer 106 is not limited in the invention. In other words, the oxygen concentration in the first electrode layer 106 increases from the bottom portion 106a to the top portion 106b in a ladder manner, a linear manner, or a curved manner. According to the present embodiment, the oxygen concentration in the first electrode layer 106 changes from 50 mol % to 70 mol % from the bottom portion 106a to the top portion 106b. As the oxygen concentration in the first electrode layer 106 gradually increases from the bottom portion 106a to the top portion 106b, a resistance of the first electrode layer 106 thus increases from the bottom portion 106a to the top portion 106b gradually. In the present embodiment, a resistance of the first electrode layer 106 changes from $1.5\times10^{-4}$ $\Omega\cdot$cm to 5000 $\Omega\cdot$cm from the bottom portion 106a to the top portion 106b.

Accordingly, the top portion 106b of the first electrode layer 106 of the light emitting layer U of the electroluminescence device in the present embodiment has a higher oxygen concentration than that of the bottom portion 106a of the first electrode layer 106. In other words, the closer the first electrode layer 106 is to the light emitting layer 110, the higher the resistance is. Thus, the first electrode layer 106 has a sufficiently low resistance in the horizontal direction, and the high oxygen concentration in the top portion 106b of the first electrode layer 106 is equal to connecting a resistance in series with the light emitting unit U. Hence, when one of the light emitting units U is short-circuited, as the high resistance of the top portion of the first electrode layer 106 limits a current passing through the light emitting unit aforementioned, the other light emitting units are prevented from being affected. In other words, in the present embodiment, traditional electric resistance wires are omitted to increase the overall aperture of the electroluminescence device.

Figure 3:
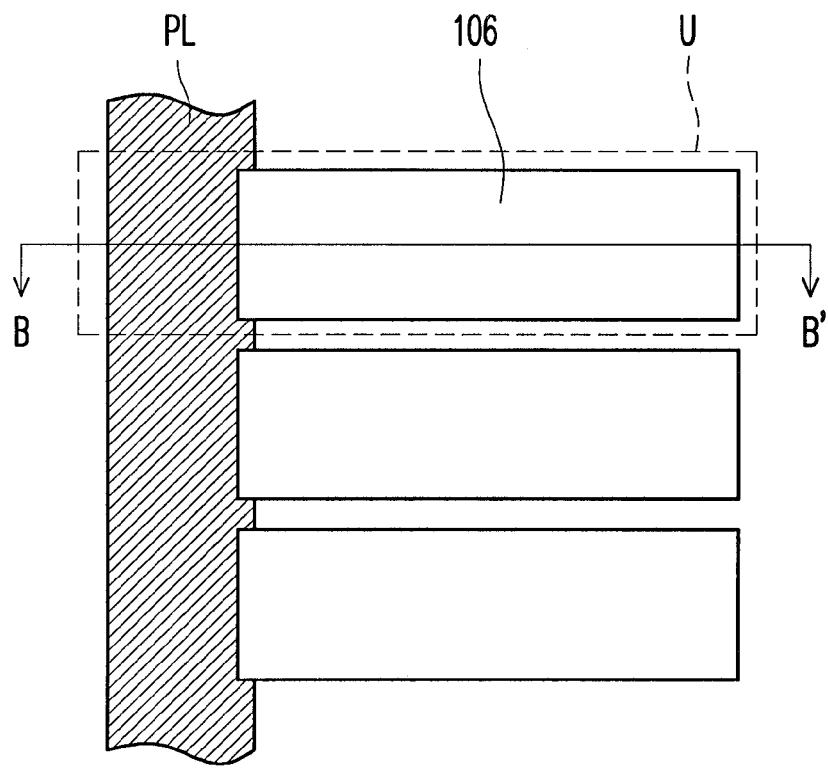
FIG. 3 illustrates a schematic partial top view of an electroluminescence device according to another embodiment of the invention.
Figure 4:
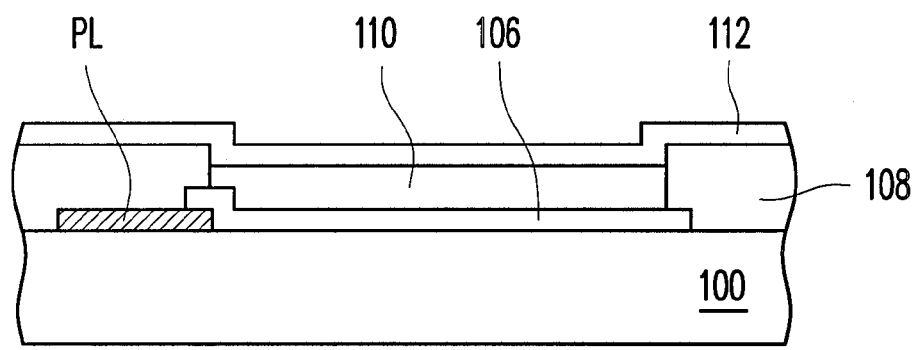
FIG. 4 shows a schematic cross-sectional view taken along line B-B' in FIG. 3.

FIG. 3 illustrates a schematic partial top view of an electroluminescence device according to another embodiment of the invention. FIG. 4 shows a schematic cross-sectional view taken along line B-B' in FIG. 3. As an embodiment in FIG. 3 (FIG. 4) is similar to the embodiment in FIG. 1 (FIG. 2), elements identical to those in FIG. 1 (FIG. 2) are denoted with identical notations and not repeated hereinafter. The embodiment in FIG. 3 (FIG. 4) and the embodiment in FIG. 1 (FIG. 2) are different in that an edge of the first electrode layer 106 and an edge of the power line PL are overlapped. In the present embodiment, as shown in FIG. 4, a first electrode layer 106 is directly covered on a power line PL, so that the first electrode layer 106 is electrically connected to the power line PL.

Similarly, in the present embodiment, the oxygen concentration in the first electrode layer 106 increases gradually from a bottom portion 106a to a top portion 106b. The oxygen concentration in the first electrode layer 106 increases from the bottom portion 106a to the top portion 106b in a ladder manner, a linear manner, or a curved manner. According to the present embodiment, the oxygen concentration in the first electrode layer 106 changes from 50 mol % to 70 mol % from the bottom portion 106a to the top portion 106b. As the oxygen concentration in the first electrode layer 106 gradually increases from the bottom portion 106a to the top portion 106b, a resistance of the first electrode layer 106 thus increases from the bottom portion 106a to the top portion 106b gradually. In the present embodiment, a resistivity of the first electrode layer 106 changes from $1.5\times10^{-4}$ $\Omega\cdot$cm to 5000 $\Omega\cdot$cm from the bottom portion 106a to the top portion 106b.

In summary, as the oxygen concentration of the top portion of the first electrode layer of the light emitting unit of the electroluminescence device in the invention is higher than the oxygen concentration of the bottom portion of the first electrode layer, so that a contact area of the first electrode layer and the light emitting layer has a higher resistance. Hence, when one of the light emitting units of the electroluminescence device is short-circuited, as a resistance of the top portion of the first electrode layer is higher, a current passing through the light emitting unit aforementioned can be limited so as to prevent the other light emitting units from being affected. In other words, as the first electrode layer having the top portion with a higher oxygen concentration is adopted in the invention, the traditional electric resistance wires can be omitted, such that the overall aperture rate of the electroluminescence device is increased.

Additionally, as the top portion of the first electrode layer of the light emitting unit of the electroluminescence device in the invention has a higher oxygen concentration, the first electrode layer already has a suitable work function. Thus, the above ultraviolet-ozone treatment is not required after the first electrode layer is formed in the invention. Consequently, the invention is cost-saving comparing to a manufacturing method of a traditional electroluminescence device.

Additionally, metal oxides with higher oxygen concentration have higher penetration rate in general. Since the top portion of the first electrode layer in the invention has a higher oxygen concentration, the first electrode layer of the invention has a higher penetration rate comparing to that of a conventional metal oxide.

In another embodiment of the invention, a power line can also be electrically connected to a second electrode layer 112 instead of a first electrode layer 106 depending on the designer's demand; however, the remaining elements are similar to those of the embodiments aforementioned and thus not reiterated hereinafter. The second electrode layer 112 has a top portion and a bottom portion. Here, a distance between the top portion and a light emitting layer is smaller than that between the bottom portion and the light emitting layer. In other words, in the present embodiment, a portion of the second electrode layer 112 close to the light emitting layer 110 is defined as the top portion and a portion of the second electrode layer 112 away from the light emitting layer 110 is defined as the bottom portion. In the present embodiment, the second electrode layer 112 is a single layer, for example. The top portion of the second electrode layer 112 has a higher oxygen concentration than that of the bottom portion. Here, the oxygen concentration in the second electrode layer increases gradually from the bottom portion to the top portion. The oxygen concentration in the second electrode layer increases from the bottom portion to the top portion in a ladder manner, a linear manner, or a curved manner. A resistance of the second electrode layer changes from $1.5\times10^{-4}$ $\Omega\cdot cm$ to 5000 $\Omega\cdot cm$ from the bottom portion to the top portion. In the present embodiment, the second electrode layer 112 is a cathode.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light emitting unit of an electroluminescence device, the light emitting unit comprising:
    a first electrode layer disposed on a substrate, wherein a top portion of the first electrode layer has an oxygen concentration higher than an oxygen concentration of a bottom portion of the first electrode layer;
    a light emitting layer disposed on the first electrode layer,
    a second electrode layer disposed on the light emitting layer; and
    a power line disposed on the substrate, wherein the first electrode layer is electrically connected to the power line, and an edge of the first electrode layer and an edge of the power line are connected directly.

2. The light emitting unit of the electroluminescence device as claimed in claim 1, wherein the oxygen concentration in the first electrode layer increases gradually from the bottom portion to the top portion.

3. The light emitting unit of the electroluminescence device as claimed in claim 2, wherein the oxygen concentration in the first electrode layer increases from the bottom portion to the top portion in a linear manner or a curved manner.

4. The light emitting unit of the electroluminescence device as claimed in claim 1, wherein the oxygen concentration of the first electrode layer close to the light emitting layer is higher than the oxygen concentration of the first electrode layer close to the substrate.

5. The light emitting unit of the electroluminescence device as claimed in claim 1, wherein a resistance of the first electrode layer changes from $1.5\times10^{-4}$ $\Omega\cdot cm$ to 5000 $\Omega\cdot cm$ from the bottom portion to the top portion.

6. The light emitting unit of the electroluminescence device as claimed in claim 1, wherein the oxygen concentration in the first electrode layer changes from 50 mol % to 70 mol % from the bottom portion to the top portion.

7. The light emitting unit of the electroluminescence device as claimed in claim 1, wherein the first electrode layer comprises a metal oxide.

8. A light emitting unit of an electroluminescence device, the light emitting unit comprising:
    a first electrode layer;
    a second electrode layer having a top portion and a bottom portion,
    a power line disposed on the substrate, wherein the first electrode layer is electrically connected to the power line, and an edge of the first electrode layer and an edge of the power line are connected directly; and
    a light emitting layer located between the first electrode layer and the second electrode layer, wherein a distance between the top portion and the light emitting layer is smaller than a distance between the bottom portion and the light emitting layer, and an oxygen concentration of the top portion is higher than an oxygen concentration of the bottom portion.

9. The light emitting unit of the electroluminescence device as claimed in claim 8, wherein the oxygen concentration in the second electrode layer increases gradually from the bottom portion to the top portion.

10. The light emitting unit of the electroluminescence device as claimed in claim 8, wherein the oxygen concentration in the second electrode layer increases from the bottom portion to the top portion in a linear manner or a curved manner.

11. The light emitting unit of the electroluminescence device as claimed in claim 8, wherein a resistance of the second electrode layer changes from $1.5\times10^{-4}$ $\Omega\cdot cm$ to 5000 $\Omega\cdot cm$ from the bottom portion to the top portion.

12. The light emitting unit of the electroluminescence device as claimed in claim 8, wherein the second electrode layer is a cathode.

13. A manufacturing method of a light emitting unit of an electroluminescence device, the method comprising:
    forming a power line on a substrate;
    forming a first electrode layer on the substrate, the first electrode layer being electrically connected to the power line, and an edge of the first electronic layer and an edge of the power line being connected directly, wherein a method of forming the first electrode layer comprises performing a deposition process including passing oxygen, and a concentration of oxygen passed in increases with a duration of the deposition process;
    forming a light emitting layer on the first electrode layer; and
    forming a second electrode layer on the light emitting layer.

14. A manufacturing method of the light emitting unit of the electroluminescence device as claimed in claim 13, wherein the deposition process further comprises passing an inert gas, and a flow rate ratio of oxygen and the inert gas increases from 1:10 to 1:1 along the duration of the deposition process.

15. The manufacturing method of the light emitting unit of the electroluminescence device as claimed in claim 14, wherein the inert gas comprises argon gas, helium (He), neon (Ne), argon (Ar), krypton (Kr), xenon (Xe), radon (Rn), or a combination thereof.

16. The manufacturing method of the light emitting unit of the electroluminescence device as claimed in claim 13, wherein an ultraviolet-ozone treatment is not required after the first electrode layer is formed.

17. The manufacturing method of the light emitting unit of the electroluminescence device as claimed in claim 13, wherein the first electrode layer comprises a metal oxide.

18. The light emitting unit of the electroluminescence device as claimed in claim 1, wherein a side surface of the first electrode layer contacts to a side surface of the power line, such that the first electrode layer and the power line are coplanar.

19. The light emitting unit of the electroluminescence device as claimed in claim 8, wherein a side surface of the first electrode layer contacts to a side surface of the power line, such that the first electrode layer and the power line are coplanar.

20. The manufacturing method of the light emitting unit of the electroluminescence device as claimed in claim 13, wherein a side surface of the first electrode layer contacts to a side surface of the power line, such that the first electrode layer and the power line are coplanar.

21. A light emitting unit of an electroluminescence device, the light emitting unit comprising:
  a first electrode layer disposed on a substrate, wherein a top portion of the first electrode layer has an oxygen concentration higher than an oxygen concentration of a bottom portion of the first electrode layer;
  a light emitting layer disposed on the first electrode layer;
  a second electrode layer disposed on the light emitting layer; and
  a power line disposed on the substrate, wherein the first electrode layer is electrically connected to the power line and wherein a side surface of the first electrode layer contacts to a side surface of the power line, such that the first electrode layer and the power line are coplanar.

22. The light emitting unit of the electroluminescence device as claimed in claim 21, wherein the oxygen concentration in the first electrode layer increases from the bottom portion to the top portion in a linear manner or a curved manner.

* * * * *